United States Patent [19]

Wennekers

[11] Patent Number: 5,037,770

[45] Date of Patent: Aug. 6, 1991

[54] PROCESS FOR THE PRODUCTION OF A FIELD EFFECT TRANSISTOR USING A LANTHANUM ARSENIDE CONTACT LAYER

[75] Inventor: Peter Wennekers, Freiburg, Fed. Rep. of Germany

[73] Assignee: Fraunhofer-Gesellschaft Zur Forderung der Angewandten Forschung E.V., Munich, Fed. Rep. of Germany

[21] Appl. No.: 586,504

[22] Filed: Sep. 21, 1990

Related U.S. Application Data

[62] Division of Ser. No. 437,700, Nov. 16, 1989, Pat. No. 4,979,003.

[30] Foreign Application Priority Data

Dec. 20, 1988 [DE] Fed. Rep. of Germany ....... 3842863

[51] Int. Cl.$^5$ .......................................... H01L 21/265
[52] U.S. Cl. ............................ 437/41; 148/DIG. 20; 437/81; 437/105; 437/126; 437/912
[58] Field of Search .................. 148/DIG. 20, 56, 65, 148/53, 72, 169, 33, 33.1, 33.3; 156/610–614; 427/248.1, 255.1; 357/16, 22, 71; 437/22, 41, 81, 105, 126, 133, 107, 176, 936, 912

[56] References Cited

U.S. PATENT DOCUMENTS 4,339,302  7/1982  Faktor et al. ................... 156/606
4,882,206  11/1989  Erbil ............................. 427/235.1

OTHER PUBLICATIONS

Yokotsuka et al., "Schottky Interface Formation Between Lanthanum Heriboride and Galliuma Arsenide . . . ", Jpn. J. Appl. Phys. Part 1, 28(6), 1989, pp. 1046–1049.
Bespalov et al., ". . . Influence of Fore-Earth Elements on Properties of Gallium Arsenide . . . ", Kratk. Soobshch. Fiz., (9), 1987, pp. 32–34.
Bennett et al., ". . . Rare Earth Epitaxial Structures Grown by MBE onto (III) Gallium Arsenide", Mater. Res. Soc. Symp. Proc., 151, 1989, pp. 277–282.

Primary Examiner—Olik Chaudhuri
Assistant Examiner—William D. Bunch
Attorney, Agent, or Firm—Jeffers, Hoffman & Niewyk

[57] ABSTRACT

In a field effect transistor, nonalloyed ohmic source-drain contacts (7, 8) are made possible, as the channel layer (3) is coated with lanthanide-arsenide which serves as contact-mediating layer and is covered with a very thin, conducting, monocrystalline, epitactic gallium-arsenide layer (10) on which nickel (11) is vaporized, an alloying step being dispensed with.

10 Claims, 1 Drawing Sheet

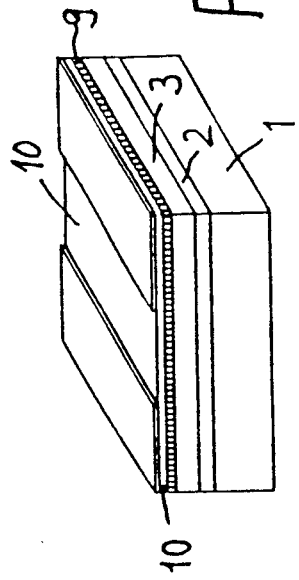
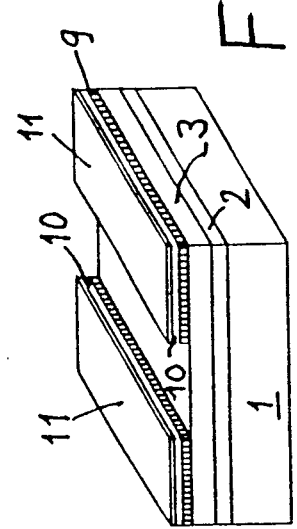
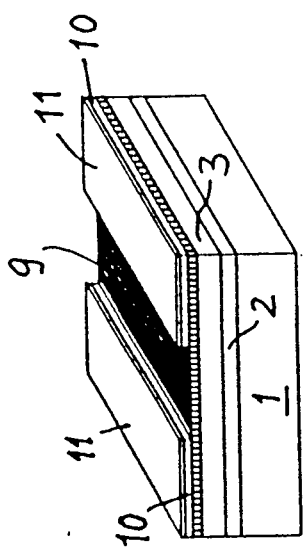
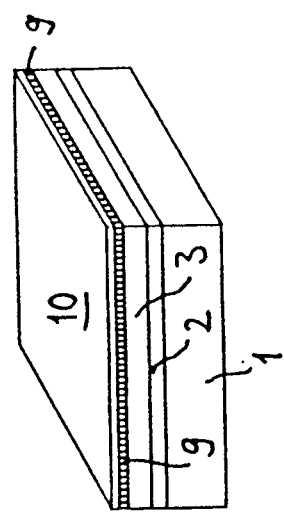
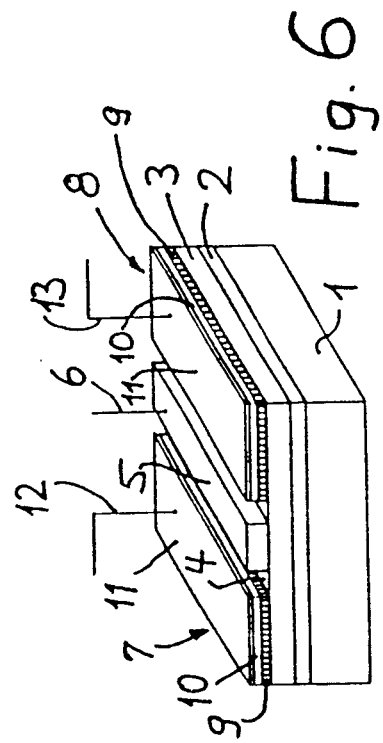

PROCESS FOR THE PRODUCTION OF A FIELD EFFECT TRANSISTOR USING A LANTHANUM ARSENIDE CONTACT LAYER

This is a division of application Ser. No. 437,700, filed Nov. 16, 1989 now U.S. Pat. No. 4,979,003.

BACKGROUND OF THE INVENTION

The invention relates to a field effect transistor with a layer sequence of a semi-insulating substrate, of an epitactically grown undoped gallium-aluminum-arsenide or gallium-arsenide buffer layer and of a channel layer, of a well-conducting doped gallium-arsenide, on which for the source electrode and drain electrode there are applied in lateral spacing from one another metallically coated gallium-arsenide cover layer strips, between which as gate electrode there is present a metal strip applied directly to the channel layer.

Further, the invention relates to a process for producing a field effect transistor, in which to a gallium-arsenide plate serving as substrate, there is applied a buffer layer of gallium-arsenide or gallium-aluminum-arsenide and thereupon epitactically a conducting channel layer of gallium-arsenide doped with silicon before, for the source- and drain electrodes- there is generated a cover layer of a well-conducting, doped gallium-arsenide with a structured metal vaporizing-on, in which system the cover layer is etched off between the source electrode and the drain electrode up to the channel layer before the applying of the gate electrode.

Such a gallium-arsenide heterojunction field effect transistor as well as such a process for its production are known, in which the vaporizing-on of nickel, gold and germanium for the source-drain contacts is followed by an alloying step, in which there are used temperatures of about 400° C. This treatment occurs in a furnace and leads to the result that the metal layer is embedded into the gallium-arsenide. In the process the metal layer melts up, so that the electrode is spread laterally and an uneven formation of the electrode edges occurs. Thereby the lateral spacing varies between the source contact and the drain contact along the parallel-running contact path.

The field strength in the current-transversed field effect transistor has its greatest value in the place of the least contact spacing. The flow lines between the contacts are concentrated upon this place, whereby the contact is severely burdened thermally there and is easily destroyed. A further disadvantage lies in that the alloying-in of the metal layer does not occur uniformly everywhere in the electrode surface. Thereby the contact resistant varies locally. The current flux is concentrate on the zones of the least contact resistance, whereby the contact can easily be thermally overloaded. Through the fluctuations of the contact resistance in the electrode surface, the mean contact resistance is greater than would be possible with a homogneous, but difficult-to-achieve alloying-in. Through the greater contact resistance there is caused a stronger noise of the field effect transistor.

It has already been attempted to avoid the alloying-in operation by the means that the gallium-arsenide cover layer is extremely highly doped with silicon, as is described in ELECTRONICS LETTERS, volume 22, No. 10, pages 510 to 512 in the article "First Successful Fabrications of High-Performance All-Refractory-Metal (Ta-Au) GaAs FET Using Very Highly Doped N+ Layers and Nonalloyed Ohmic Contacts". In the known process, however, because of the high silicon doping oval defects develop in the gallium-arsenide cover layer.

Kirchner et al described in the article "Low-Resistance Nonalloyed Ohmic Contacts to Si-Doped Molecular Beam Epitaxial GaAs". Appl Phys. Lett. 47 (1), July 1, 1985, pages 26 to 28, that the electron concentration the gallium-arsenide, as a consequence of a high doping with silicon, reaches a maximal concentration which limits the attainable contact resistance.

SUMMARY OF THE INVENTION

Underlaying the invention is the problem of creating a low-noise, well reproducible field effect transistor, for the production of which no alloying steps making necessary high ambient temperatures are necessary.

This problem is solved in a field effect transistor of the type mentioned at the outset by the means that, between the channel layer in the gallium-arsenide cover layer strips of the source and of the drain electrode, in each case there is provided a contactmediating intermediate layer of a lanthanide-arsenide, and that the metal coatings of the source and drain electrodes are formed by a vaporized-on, nonalloyed metal layer.

In a process for producing a field effect transistor the problem is solved by the means that, after the growing of the channel layer and before the applying of the cover layer, there is generated a monocrystalline, epitactic lanthanide-arsenide layer as contacting layer, that onto the cover layer there are vaporized metal contact strips as source and drain contact, that in a first etching step the cover layer between the source and drain contacts is etched away and in a second etching step the lanthanide-arsenide layer between the source and drain contacts is etched away.

In an advantageous example of execution of the invention, the lanthanide-arsenide layer consists of a 3 to 5 nm thick monocrystalline, epitactic erbium-arsenide layer which is very highly conductive. The vaporized-on metal layer consists of nickel and can be provided with a gold coating before the applying of the contact wires.

In the process for the production of the field effect transistor, the arsenide layers are applied preferably in a molecular-beam epitaxy installation and the metal contact strips for the course and drain electrodes are applied preferably in a metal-vaporizing installation without alloying process. In the first etching step there is preferably used an alkaline etch with ammonium hydroxide and hydrogen superoxide, since this etch stops selectively on erbium-arsenide.

In the second etching step for the removal of the erbium-arsenide layer, it is expedient to use hydrochloric acid, since this stops selectively on the channel layer of gallium-arsenide.

BRIEF DESCRIPTION OF THE DRAWINGS

In the following, the invention is described in detail with the aid of the drawings.

FIG. 1 shows in a not-to-scale view a cut-out from a gallium-arsenide plate coated with several layers, for the production of a field effect transistor according to the invention;

FIG. 2 shows the gallium-arsenide plate according to FIG. 1 after the applying of two metal contact strips as source and drain contacts;

FIG. 3 shows the gallium-arsenide plate according to FIG. 2 after a first etching step.

FIG. 4 shows the gallium-arsenide plate after a second etching step.

FIG. 5 shows the gallium-arsenide plate according to FIG. 4 after the vaporizing-on of a narrow gate contact metal strip of titanium; and FIG. 6 shows the field effect transistor of the invention in a schematic perspective view.

DESCRIPTION OF THE PREFERRED EMBODIMENT

The production process illustrated by FIGS. 1 to 5 serves for the production of the gallium-arsenide heterojunction field effect transistor represented in FIG. 6. Obviously, the drawing is not to scale, since the various layers of the field effect transistor are many times thinner than their lengths and widths.

The field effect transistor represented in FIG. 6 has a semi-insulating gallium-arsenide substrate 1, which can be provided on its underside with a metal coating (not represented). On the substrate 1 of semi-insulating gallium-arsenide there is present an epitactically grown monocrystalline undoped buffer layer 2 of gallium-arsenide or gallium-aluminum-arsenide. The thickness of the buffer layer 2 amounts to 100 to 200 nm.

As third layer in the layer sequence of the field effect transistor there follows a channel layer 3, the thickness of which is 50 nm to 150 nm. The channel layer 3 consists of epitactically grown monocrystalline gallium-arsenide which has good electron-conducting properties.

Along the surface 4 of the channel layer 3 there extends a metal strip 5 of titanium or tungsten, which forms the gate electrode of the field effect transistor and which is connected with a contact wire 6 for the gate connection.

Parallel to the metal strip 5 serving as gate electrode there extend in FIG. 6, left, a source electrode 7 and, to the right in FIG. 6 a drain electrode 8, the layer sequences of which are identical.

The source electrode 7 and the drain electrode 8 have in each case a contact intermediate layer 9 with a thickness of 3 to 5 nm. The intermediate layer 9 consists of a very well-conducting monocrystalline grown epitactic lanthanide-arsenide layer, in particular a layer of erbium-arsenide.

The interlayers 9 of the source electrode 7 and of the drain electrode 8 are constructed in each case as parallel-running strips which extend parallel to the metal strip 5 of the gate electrode. The intermediate layers 9 are coated in each case with a very thin cover layer 10 with a thickness of about 50 nm, which serves as protection for the interlayer 9, in particular of erbium-arsenide. The cover layer 10 consists of monocrystalline epitactically grown gallium-arsenide which is doped with silicon and is conductive.

The upper side facing away from the interlayer 9 of the source electrode 7 and of the drain electrode 8 of the cover layer 10 is provided with a nickel layer 11, the upper side of which can be coated with gold.

To the source electrode 7 there is connected a source contact wire 12. Correspondingly, a drain contact wire 13 is connected with the upper side of the possibly gilded nickel layer 11 of the drain electrode 8. The nickel layer 11 forms on the source electrode 7 and the drain electrode 8 in each case vaporized-on parallel-running contact paths which have been applied without an alloying step. For this reason, it is a matter with the source electrode 7 and the drain electrode 8 of nonalloyed source-drain contacts.

The above-described gallium-arsenide field effect transistor with its ohmic contacts can be produced very simply and precisely.

In order to generate the plate represented enlarged in its thickness in FIG. 1, a flat gallium-arsenide plate which forms the semi-insulating gallium-arsenide substrate 1 of the finished field transistor, is heated up in a molecular-beam epitaxy installation on a heated plate holder in a vacuum to 550 to 600° C. In the molecular-beam epitaxy installation (not represented in the drawing), there are present five crucibles which are filled in each case with arsenic, gallium, aluminum, silicon and lanthanide, in particular erbium. By opening the covers of the crucibles and heating the contents of the crucibles, vapors are generated which condense on the surface of the substrate 1.

In a first step, the arsenic crucible and the gallium crucible, possibly together with an aluminum crucible, are heated with open cover. Thereby there is formed by condensation on the surface of the substrate 1 a monocrystalline gallium-arsenide layer or gallium-aluminum-arsenide layer which in the finished transistor forms the buffer layer 2.

For the production of the channel layer 3, the arsenic crucible, the gallium crucible and the silicon crucible are heated, in each case with the cover open. The silicon atoms make the channel layer 3 electrically conducting. Through the choice of the temperature of the silicon furnace, the electric conductivity of the channel layer 3 is adjusted. The thickness of the channel layer 3 is determined by the opening time of the cover of the gallium crucible. After the desired thickness of the channel layer 3 of about 50 nm to 150 nm is reached, the silicon crucible and then the gallium crucible are closed. The erbium crucible is then opened, the erbium slowly evaporating. Arsenic and erbium vapor crystallize monocrystallinely on the channel layer 3 and form an epitactic erbium-arsenide layer, which in the finished field effect transistor as intermediate layer 9, makes possible the setting up of nonalloyed source-drain contacts. The growth speed in adjusted by the temperature of the erbium crucible. After the growing of the 3 to 5 nm thick monocrystalline erbium-arsenide layer, the erbium crucible is closed.

Thereupon, first the gallium crucible and then the silicon crucible is opened. There a very thin electrically conducting gallium-arsenide layer will grow, which forms the cover layer 10 of the field effect transistor. The cover layer 10 grows monocrystalline epitactic on the monocrystalline interlayer 9. The cover layer 10 serves for the protection of the intermediate layer 9 of erbium-arsenide.

In the next process step, the plate represented in FIG. 1 is removed from the molecular-beam epitaxy installation. In a metal vaporizing installation there are vaporized onto cover layer 10 two parallel-running metal contact strips of a nickel layer 11 as source and drain contact. Thus, there is yielded the structure represented in FIG. 2. The zone of the cover layer 10 of gallium arsenide laying free between the two metal contact strips formed by the nickel layer 11 is etched off with an alkaline etch (mordant). The etch contains ammonium hydroxide and hydrogen superoxide. The etch stops selectively on the interlayer of erbium-arsenide. There is yielded then the structure represented in FIG. 3.

In FIG. 4 there is perceived a further intermediate step for the production of the field effect transistor. Proceeding from the intermediate step represented in FIG. 3, the interlayer 9 of erbium-arsenide is removed in an acid etch in the zone between the metal contact strips of the nickel layer 11. The etch contains hydrogen chloride. Such an etch stops selectively on the channel layer 3 of doped gallium-arsenide.

By vaporizing-on of a narrow metal strip 5 corresponding to FIG. 5 between the two contact strips of the nickel layer 11, the gate contact of the field effect transistor is generated. As material for the vaporizing-on of the metal strip 5 titanium or tungsten is used.

In the last production step represented in the drawing, the metal strip 5 and the contact strips of the nickel layer 11 are provided with the source-contact wire 12, the drain contact wire 13 and the contact wire 6. FIG. 6 shows the already described field effect transistor with nonalloyed ohmic source and drain contacts.

While this invention has been described as having a preferred design, it will be understood that it is capable of further modification. This application is therefore intended to cover any variations, uses, or adaptations of the invention following the general principles thereof and including such departures from the present disclosure as come within known or customary practice in the art to which this invention pertains and fall within the limits of the appended claims.

What is claimed is:

1. Process for the production of a field effect transistor, in which onto a gallium-arsenide plate serving as substrate there is epitactically applied a buffer layer of gallium-arsenide or gallium-aluminum-arsenide and thereupon epitactically a conducting channel layer of gallium-arsenide doped with silicon, before for the source and drain electrode a cover layer is generated of well-conducting, doped gallium-arsenide with a structured metal vaporizing-on, in which process the cover layer between the source and the drain electrode is etched off up to the channel layer before the application of the gate electrode, characterized in that after the growing of the channel layer and before the application of the cover layer, there is generated a monocrystalline epitactic lanthanide-arsenide layer as contact-mediating layer, that onto the cover layer there are vaporized metal contact strips as source and drain contact, that in a first etching step the cover layer between the source and drain contacts is etched away and in a second etching step, the lanthanide-arsenide layer between the source and drain contacts is etched away.

2. Process according to claim 1, characterized in that the arsenide layers are applied in a molecular-beam epitaxy installation and the metal contact strips for the source and drain electrodes are applied without alloying process in a metal vaporizing installation.

3. Process according to claim 1, characterized in that as lanthanide arsenide there is used erbium arsenide.

4. Process according to claim 1, characterized in that, in the first etching step, there is used an alkaline etch with ammonium hydroxide and hydrogen superoxide.

5. Process according to claim 3, characterized in that, in the second etching step, hydrochloric acid is used.

6. The process according to claim 2, characterized in that as lanthanide-arsenide there is used erbium arsenide.

7. The process according to claim 2, characterized in that, in the first etching step, there is used an alkaline etch with ammonium hydroxide and hydrogen superoxide.

8. The process according to claim 3, characterized in that, in the first etching step, there is used an alkaline etch with ammonium hydroxide and hydrogen superoxide.

9. The process according to claim 1, characterized in that the metal contact strips are formed by vaporizing-on of nickel and gold.

10. The process according to claim 2, characterized in that the metal contact strips are formed by vaporizing-on of nickel and gold.

* * * * *